United States Patent
Yuan et al.

(10) Patent No.: US 7,924,641 B2
(45) Date of Patent: Apr. 12, 2011

(54) DATA FLOW SCHEME FOR LOW POWER DRAM

(75) Inventors: Der-Min Yuan, Hsin-Chu (TW); Shih-Hsing Wang, Hsinchu (TW)

(73) Assignee: Etron Technology, Inc., Hsin-Chu (TW)

( * ) Notice: Subject to any disclaimer, the term of this patent is extended or adjusted under 35 U.S.C. 154(b) by 181 days.

(21) Appl. No.: 12/079,446

(22) Filed: Mar. 27, 2008

(65) Prior Publication Data

US 2008/0219071 A1    Sep. 11, 2008

Related U.S. Application Data

(62) Division of application No. 11/325,665, filed on Jan. 4, 2006, now Pat. No. 7,359,265.

(51) Int. Cl.
*G11C 7/00* (2006.01)
(52) U.S. Cl. ........................ 365/203; 365/226; 365/185.2
(58) Field of Classification Search ............... 365/185.2, 365/185.18, 189.06, 206, 185.11, 210, 207, 365/185.17; 356/230.03
See application file for complete search history.

(56) References Cited

U.S. PATENT DOCUMENTS

| | | | |
|---|---|---|---|
| 5,784,329 A * | 7/1998 | Blankenship et al. | 365/227 |
| 5,892,722 A | 4/1999 | Jang et al. | |
| 6,021,067 A * | 2/2000 | Ha | 365/185.21 |
| 6,147,916 A | 11/2000 | Ogura | |
| 6,549,470 B2 * | 4/2003 | Hardee et al. | 365/189.05 |
| 6,556,482 B2 | 4/2003 | Shimoyama et al. | |
| 6,711,079 B2 * | 3/2004 | Kang | 365/207 |
| 2006/0048022 A1* | 3/2006 | Versen et al. | 714/718 |
| 2007/0013402 A1* | 1/2007 | Ong et al. | 324/765 |

* cited by examiner

*Primary Examiner* — Dang T Nguyen
(74) *Attorney, Agent, or Firm* — Saile Ackerman LLC; Stephen B. Ackerman

(57) ABSTRACT

Circuits and methods to minimize power required for sensing and precharge of DRAMs have been achieved. A control circuit ensures that during READ operations the duration of sensing of DRAM cell and precharging is kept to a minimum. A test DRAM cell is used to determine the exact time required for data sensing. Furthermore no precharging is performed during WRITE-operations. In case data is changing from "1" to "0" or vice versa data lines are inverted accordingly during WRITE operation.

3 Claims, 4 Drawing Sheets

DATA FLOW SCHEME FOR LOW POWER DRAM

This is a divisional application of U.S. patent application Ser. No. 11/325,665 filed on Jan. 4, 2006 now U.S. Pat. No. 7,359,265, which is herein incorporated by reference in its entirety, and assigned to a common assignee.

BACKGROUND OF THE INVENTION (1) Field of the Invention

This invention relates generally to DRAM memories and relates more particularly to methods to reduce power consumption during read/write operation from/to DRAM memory cells.

(2) Description of the Prior Art

The importance of optimizing the power consumption of memory systems is growing rapidly. Many new applications are more and more data-intensive. For ASICs and embedded systems memory systems can contribute up to 90% of the power consumption of the total system.

In prior art in order to reduce energy consumption pulsed word lines have been introduced to isolate memory cells from the bit lines after sensing thus preventing the cells from changing the bit line voltage further. The generation of word line pulses is very critical because in case they are too short, the sense amplifier operation may fail and if the word pulses are too long too much power will be consumed.

There are known patents dealing with precharging of DRAMs.

U.S. Pat. No. 6,147,916 (to Ogura) teaches a semiconductor memory device, such as a DRAM, including a memory cell array and pairs of bit lines connected to the memory cells in the array. A precharge circuit is connected the bit line pairs and selectively provides the bit line pairs with a reference power supply voltage when the memory cells are being accessed and a precharge voltage when the memory cells are not being accessed. A correction circuit adjusts the precharge voltage in accordance with a difference between the precharge voltage and the reference power supply voltage so that the precharge voltage becomes substantially equal to the reference power supply voltage. A retention mode determination circuit detects when the memory device is in a retention mode (powered down state) and prevents access to the memory cells at this time.

U.S. Pat. No. 6,556,482 (to Shimoyama et al.) discloses a semiconductor memory device including an address register circuit and data register circuit that can store a write address and write data from one write operation and output the stored write address and write data during a subsequent write operation. In a dynamic random access memory (DRAM) embodiment, a precharge and/or refresh operation may follow the writing of previously stored write data. Such an arrangement may reduce and/or eliminate a read after write timing requirement (TWR), which can improve the operating speed of the semiconductor memory device.

U.S. Pat. No. 5,892,722 (to Jang et al.) introduces a column selection circuit, in which a layout area is minimized by reducing the number of data bus lines and sensing speed characteristic is improved by reducing sensing time of a bit line. In a memory for transmitting data stored in a memory cell to a main sensing amplifier through a bit line and a bit bar line and storing the data output from the main sensing amplifier in the memory cell through the bit line and the bit bar line, the column selection circuit includes an equalizer for equalizing the bit line and the bit bar line, a bit line sensing amplifier for compensating signal voltage levels of the bit line and the bit bar line as a word line is selected, first and second enable signal output portions for outputting enable signals to operate the bit line sensing amplifier, a data bus line and a data bus bar line for transmitting the data transmitted to the bit line and the bit bar line from the memory cell to the main sensing amplifier, and transmitting the data output from the main sensing amplifier to the bit line and the bit bar line, a data transmission portion for selectively transmitting the data of the data bus line and data bus bar line and the data of the bit line and bit bar line between the respective lines in response to a column selection signal, a control signal for reading and a write enable signal, and a precharge level adjusting portion for adjusting precharge level of the data bus line and the data bus bar line.

SUMMARY OF THE INVENTION

A principal object of the present invention is to achieve a method to reduce power consumption of DRAMs.

A further object of the present invention is to achieve a circuit to minimize power consumption during READ operation of a DRAM.

A further object of the present invention is to achieve a circuit to minimize power consumption during WRITE operation of a DRAM.

In accordance with the objects of this invention a method to reduce power consumption of a DRAM has been achieved. The method invented comprises, first, to provide a DRAM cell array and a control circuit to control ON and OFF times of a bit switch controlling READ/WRITE operations of a DRAM. The following steps of the method invented comprise to minimize duration of sensing of data lines of a DRAM during READ operation by said control circuit by controlling bit switch ON/OFF timing, to minimize duration of precharge of data lines of a DRAM during READ operation by said control circuit by controlling bit switch ON/OFF timing, and finally, to perform WRITE operations to a DRAM without precharging between WRITE operations.

In accordance with further objects of this invention a circuit to minimize duration of sensing data from a DRAM during READ operation has been achieved. The circuit invented comprises a control circuit controlling a bit switch, wherein precharging of a data line of said RAM is performed during OFF time of said bit switch and sensing of data is performed during ON-time of said bit switch. An important part of this control circuit is a data sensing tracking circuit providing a signal after data sensing from data lines is completed.

In accordance with further objects of this invention a circuit to minimize duration of sensing data from a DRAM and to minimize duration of precharge of data lines of a DRAM during READ operation has been achieved. The circuit invented comprises, first, a logical AND-gate having two inputs and one output, wherein a first input is a READ-command and a second input is the output of an inverter stage and the output of said AND-gate is the input of a data sensing tracking circuit and of a delay circuit. Furthermore the circuit comprises said data sensing tracking circuit issuing a signal when a READ-command is completed wherein this signal is a RESET input of a first Flip-flop circuit, said delay circuit wherein its output is a SET input of said Flip-Flop circuit, and said first Flip-Flop circuit, wherein its Q-output is a first input of an OR-gate and of a SET-input of a second Flip-Flop circuit. Moreover the circuit comprises said second Flip-Flop circuit wherein its RESET input is a synchronization pulse and its Q-output is a second input of said OR-gate, said OR-gate wherein its third input is said synchronization pulse and its output is the input of said inverter stage, and said inverter stage wherein its output is said second input of said AND-gate and a first input of a control circuit controlling a bit switch. Finally the circuit comprises said control circuit controlling a bit switch wherein its second input is said READ-command and its output controls said bit switch wherein precharging of a data line of said RAM is performed during OFF time of said bit switch only.

In accordance with further objects of this invention a circuit to perform WRITE operations to a DRAM without precharging of data lines between WRITE operations has been achieved. The circuit invented comprises, first, an inverting amplifier having an input and an output, wherein the input is data to be written in a DRAM memory cell and its output is an input of an control circuit, said control circuit analyzing said data to be written and passing said data via a second amplifier to a pair of input/output lines, wherein the data according to their polarity are written to said pair of input/output lines, wherein the inputs of said control circuits are the output of said inverting amplifier and a write command and the output is the input of said second amplifier. Furthermore the circuit invented comprises said second amplifier having an input and an output, wherein the input is the output of said control circuit and its output is written to said pair of input/output lines, said pair of input/output lines, and a switch connected on a first side with two lines to said pair of input/output lines and on its second side with two lines via a sense amplifier to a selected DRAM cell, wherein said switch is activated by a select command, selecting a defined DRAM for WRITE operation. Finally the circuit invented comprises said sense amplifier being connected on a first side with said switch and on a second side via a pair of data lines to a DRAM cell selected, and said DRAM cell being controlled by a bit switch signal, wherein said DRAM cell is part of a memory array.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose methods and circuits for a DRAM memory having a reduced power consumption by optimizing the pre-charging power of bit lines during read operation and avoiding pre-charging between write operation.

Figure 1:
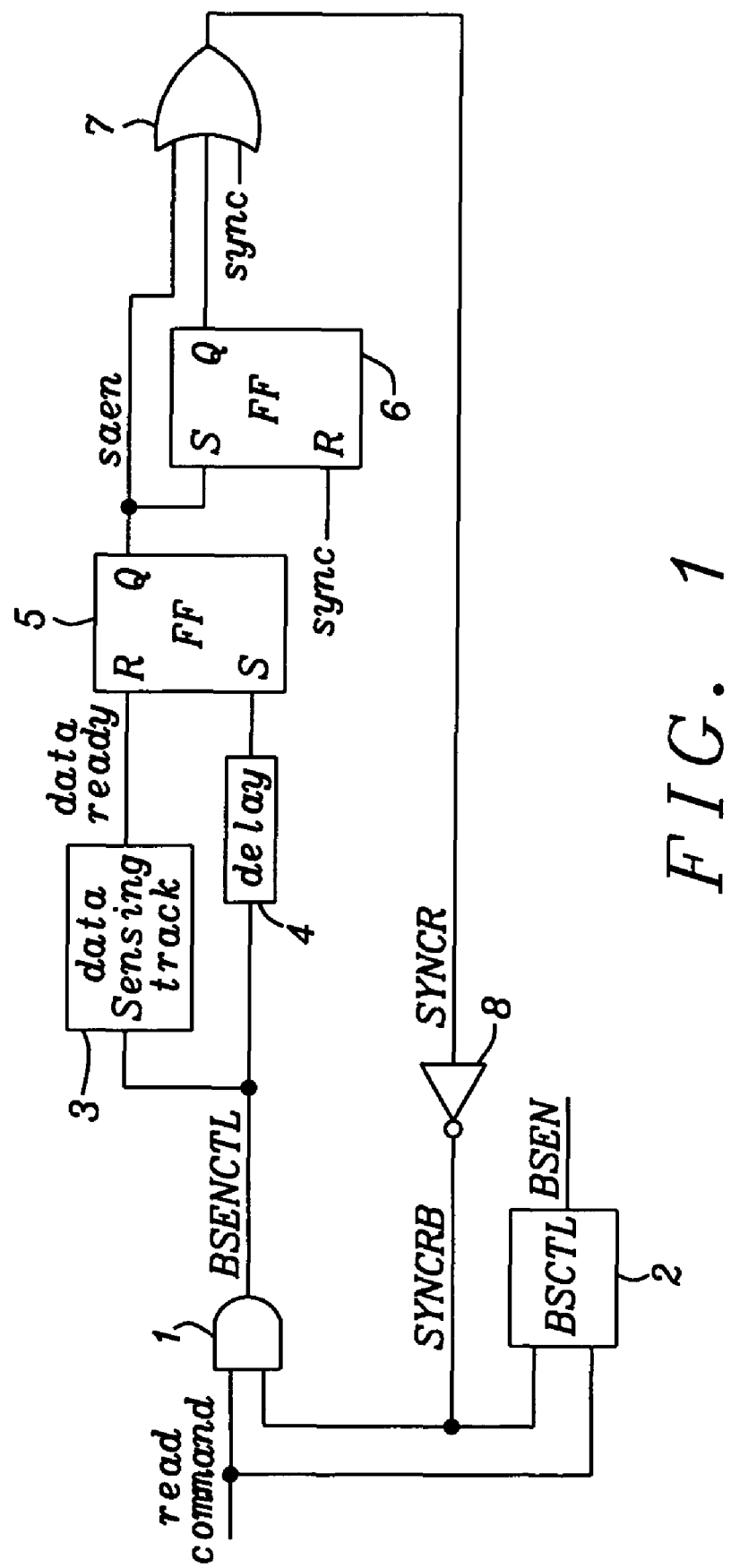
FIG. 1 shows a schematic block diagram of a circuit to minimize precharging during Read operation of a DRAM.
Figure 2:
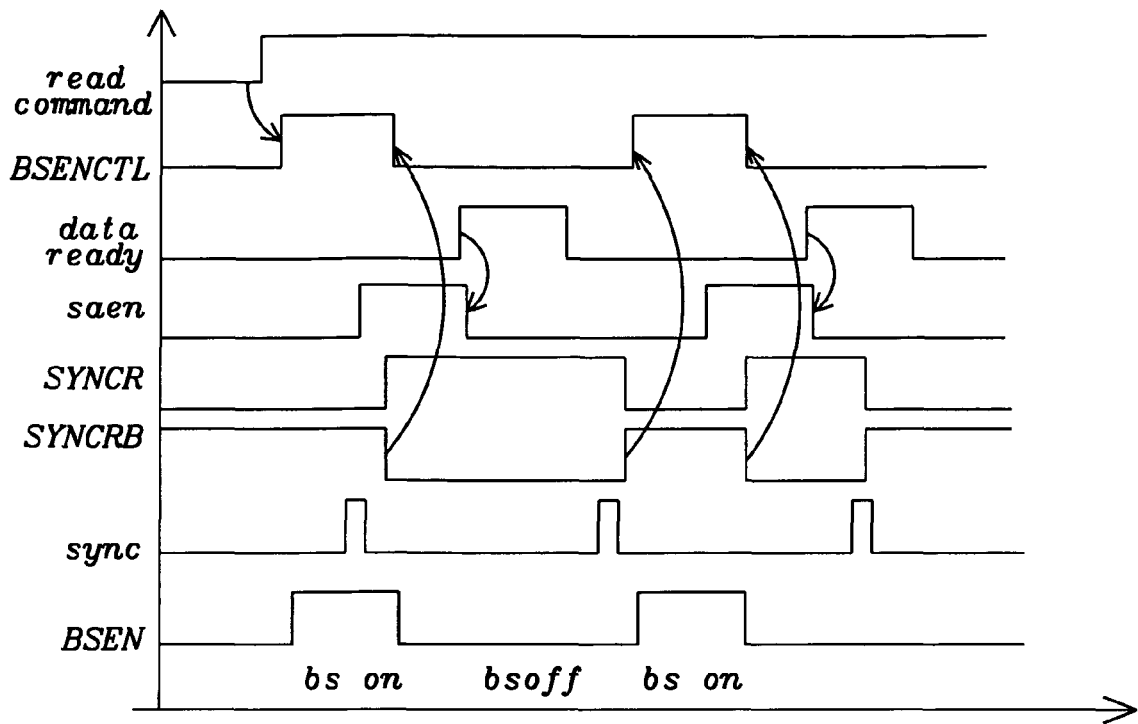
FIG. 2 shows a time chart of the major signals of the circuit shown in FIG. 1.

FIG. 1 shows a schematic block diagram of a circuit to reduce DRAM power consumption during a read-operation by reducing pre-charging of the bit-lines to a minimum and FIG. 2 shows time diagrams of the relevant signals issued by components of the circuit shown in FIG. 1.

An AND-gate 1 has a "read-command" and a "syncrb" signal as input; both signals are shown in FIG. 2. A bit switch control enablement signal "BSENCTL", also shown in FIG. 2, is the output of this AND-gate 1. This enablement signal "BSENCTL" is the input for a circuitry 3 tracking the data sensing during a READ operation of a DRAM and for a delay circuitry 4. The delay circuitry 4 simulates the delay time of bit switch control unit BSCTL 2 generating BSEN signal. The bsoff timing is synchronized with sync signal.

The circuitry 3 tracking the data sensing during READ operation of a DRAM issues a "data ready" signal right after the data are sensed. The "data ready" signal is also shown in FIG. 2.

The next block is a flip-flop 5 having the output signal of the delay circuit 4 on its SET input port, and having the "data-ready" signal on its RESET input port. The output signal "saen" (sense amplifier enablement) of the flip-flop 5 is set, also shown in FIG. 2, after the delay time of the delay circuit 4. This signal "saen" is the SET input S of a second flip-flop 6 and a first input of an OR-gate 7 having three inputs. A synchronization pulse "sync", also shown in FIG. 2, is on the RESET input R of the second flip-flop 6 and the third input of the OR-gate 7. The synchronization pulse "sync" is generated by a base controller using an external clock. The rising edge of "data ready" signal signifies that data sensing is done causing "saen" signal (sense amplifier enablement) to fall from "1" to "0", as shown in FIG. 2. The output of the second flip-flop 6 is the second input of the OR-gate 7. Each sync pulse triggers via the second flip-flop 6 RESET input R the output Q of the flip-flop 6 to Low. Each "saen" signal triggers via the second flip-flop 6 SET input S its output Q to High.

The output signal "SYNCR" of the OR-gate 7 is inverted by inverter 8 to the signal "SYNCRB", both signals are shown in FIG. 2. The falling edge of "SYNCRB" causes the signal "BSENCTL" to fall from "1" to "0" and the rising edge of "SYNCRB" is rising "BSENCTL" as long as the "read command" is "ON".

The "read command" and "SYNCRB" signals are both inputs for a bit switch control circuit block BSCTL 2 and for the AND-gate 1 as well. This BSCTL circuit 2 issues a signal "BSEN", shown in FIG. 2, which switches a bit switch "ON" ("bs on") and "OFF". This bit switch connects bit lines to external data lines.

The falling edge of "BSEN" (bit switch enablement) signal is synchronous to the falling edge of "BSENCTL" signal this means the bit switch is off during an OFF-state of BSENCTL.

Pre-charging of the bit-lines is only performed during the OFF-state of the "BSEN" signal "bs-off", during this time the bit lines are disconnected to the data lines. The circuitry of the present invention keeps the ON-state of "BSEN" state to a minimum. The sensing current contributes the most to the power consumption of READ operation. The shorter "bs-on" time is the shorter is the duration of the sensing current. The "bs-on" time is kept as short as possible for lower power consumption but a correct data sensing is ensured. After this "bs-on" time, BSEN goes back to its normal state "bs-off" time (precharge state).

A key point of the circuit invented shown in FIG. 1 is that the falling edge of the BSEN signal, signifying "bs-off" and start of precharge is controlled by the circuit shown in FIG. 1 based on the "data ready" signal issued by the data sensing track block 3. The timing ensures sufficient time for data sensing. Precharging is performed during "bs-off". The event "bs-off" can be any time after the data is sensed; this means "data ready" is on. In the preferred embodiment shown in FIG. 2 the "bs-off" timing is synchronized with "sync" signal.

Figure 6:
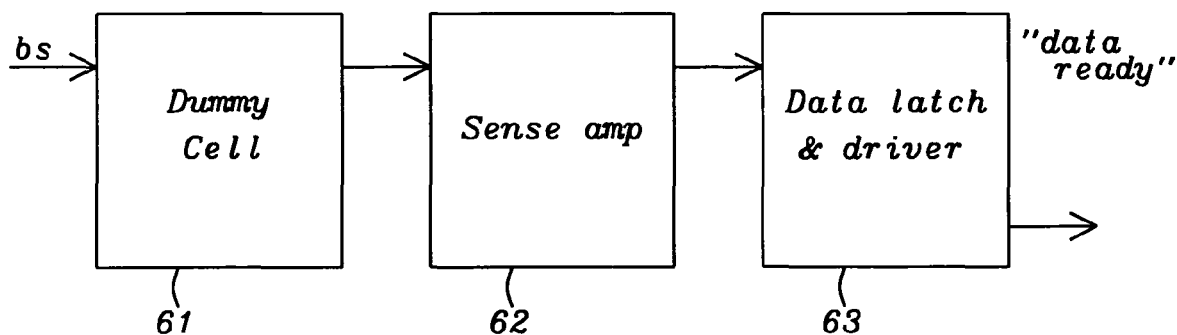
FIG. 6 shows a schematic block diagram of a data tracking sensing circuit monitoring an exact point of time when the data are actually read from a DRAM cell.

FIG. 6 shows a schematic block diagram of a preferred embodiment of a data tracking sensing circuit. The purpose of this circuit is to pinpoint an exact "data ready" time from "bs on". The data ready time is dependent upon process variations and temperature variations. A constant delay circuit to would provide an inaccurate "data ready" point of time. The data tracking sensing circuit of the present invention can pinpoint the actual process point of time.

At the event "bs on", the content of a test or dummy DRAM cell 61 is sensed by sense amplifier 62 and the data sensed from dummy DRAM cell 61 is sent to "data latch and driver" block 63 to latch this data. The output of the "data latch and driver block" 63 is a "data ready" signal. The time span between "bs on" and "data ready" signal is the exact process time required for data sensing. In a preferred embodiment a simplified sense amplifier has been used for this data tracking sensing circuit.

The same concept is used for the "delay circuit" 4. It is comprising a dummy DRAM cell, a sense amplifier and a data latch and driver bock as well. Additionally said driver block comprises fuses to fine-tune the delay time.

Figure 3:
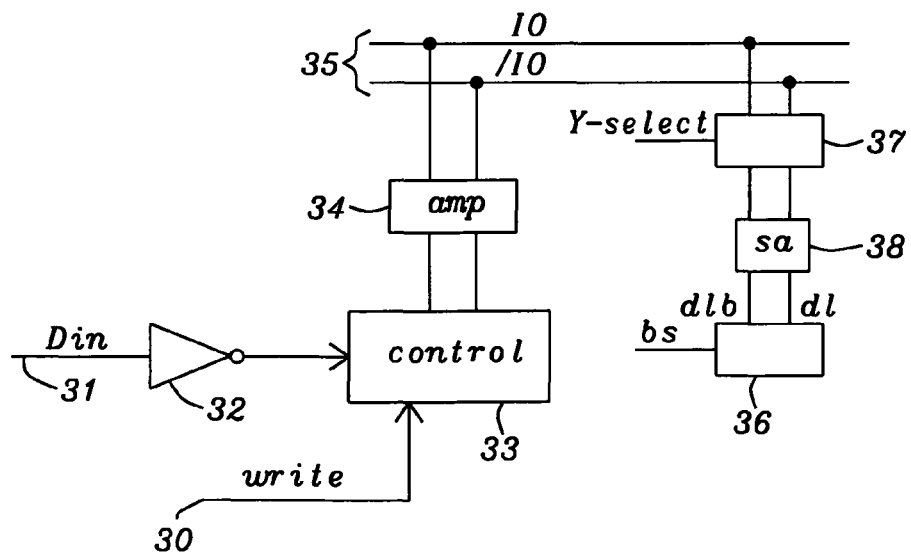
FIG. 3 shows a schematic block diagram of a circuit performing WRITE commands to a DRAM without precharge between WRITE commands.

FIG. 3 shows a circuit to perform WRITE operations without precharging in between the WRITE operations. In prior art data lines are pre-charged between WRITE operations, e using the circuit invented there is no pre-charge between WRITE operations. In case the data is not changing, e.g. a sequence of logical "1", "1", "1" the writing is performed without pre-charge. In case of a data change from "0" to "1" or vice versa there is also no pre-charge performed but the data lines are inverted accordingly.

After receiving a WRITE command the controller 33 receives via the data input Din 31 the data to be written to a DRAM cell. These data get inverted by amplifier 32 and controller 33 controls the WRITE operation of the data via amplifier 34 to the corresponding IO and /IO input/output lines 35.

Figure 4:
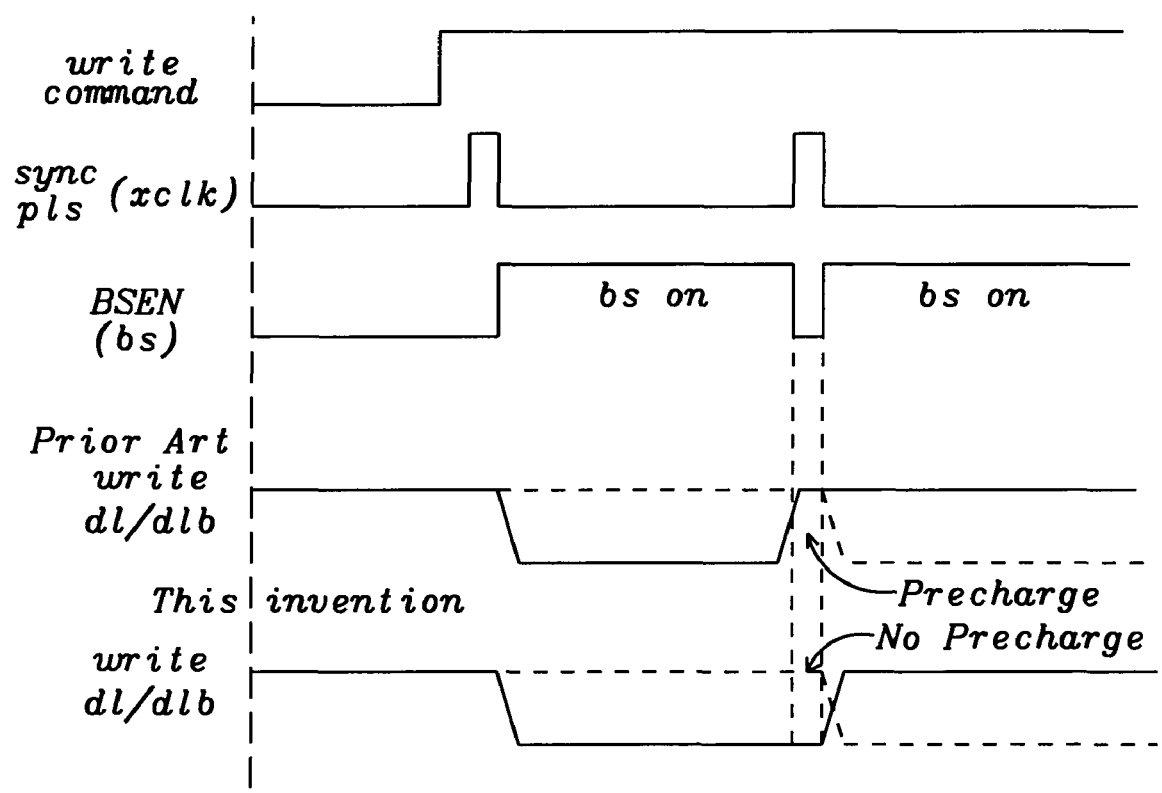
FIG. 4 shows a time chart of the major signals of the circuit shown in FIG. 3.

It is important to understand that in the present invention, as shown in FIG. 4, no pre-charging is performed, while in prior art precharging is performed between WRITE operation as long as "BSEN" signal is off.

Block 36 signifies a memory cell. Block 37 is a switch activated by "Y-select" signal. Data can be written from IO and /IO lines 35 into memory cell 36 or be read from memory cell 36 to the IO and /IO lines 35. This READ/WRITE data transfer is performed through switch 37 and sense amplifier 38 when "Y-select" signal is "ON". Sense amplifier 38 passes data from memory cell 36 to I/O & /I/O lines 35 during a READ operation and passes IO & /IO data to memory cell 36 during a WRITE operation. Control block 33 assigns Din data ("0" & "1") to the appropriate IO & /IO line 35 dependent upon their polarity ("0" or "1") via amplifier 34. The BSEN signal shown in FIG. 1 controls bs (bit switch) signal shown in FIG. 3. So, the "bs" signal shown in FIGS. 2 and 3 is controlled by "sync" signal shown in FIGS. 1 and 2.

FIG. 4 shows a time chart of the pulses related to the circuit of FIG. 3. A WRITE operation is initiated by the WRITE command. The BSEN signal is initiated ("bs on") by the falling edge of the sync pulse and goes to "0" ("bs off") with the rising edge of the sync pulse. The BSEN signal of FIG. 4 is identical to the BSEN signal shown in FIG. 2. While in prior art pre-charging during WRITE operation is done during "bs-off" time no pre-charging is performed during WRITE operation in the present invention.

Figure 5:
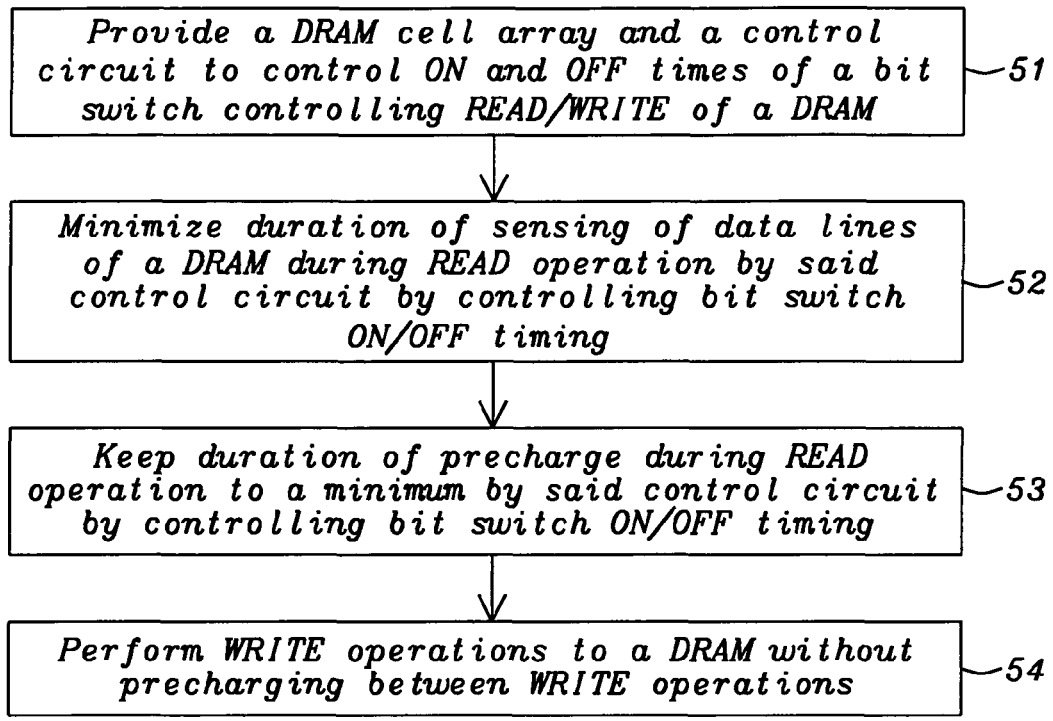
FIG. 5 shows a flow chart of a method to minimize precharging during READ and WRITE operations of a DRAM.

FIG. 5 shows a flowchart of a method invented to reduce power-consumption of DRAMs by optimizing the pre-charging power of bit lines during read operation and avoiding pre-charging at all between write operation. Step 51 describes the provision of a DRAM cell array and a control circuit to control ON and OFF times of a bit switch controlling READ/WRITE operations of a DRAM. Step 52 discloses minimizing the duration of sensing of data lines of a DRAM during READ operation by said control circuit by controlling bit switch ON/OFF timing in a way that there is sufficient time for data sensing. Step 53 discloses minimizing the duration of precharge by said control circuit by controlling bit switch ON/OFF timing. The last step 54 teaches WRITE operations to a DRAM are performed without precharging between WRITE operations.

While the invention has been particularly shown and described with reference to the preferred embodiments thereof, it will be understood by those skilled in the art that various changes in form and details may be made without departing from the spirit and scope of the invention.

What is claimed is:

1. A method to reduce power consumption of a DRAM is comprising:
   - provide a DRAM cell array and a control circuit to control ON and OFF times of a bit switch controlling READ/WRITE operations of a DRAM;
   - minimize duration of sensing of data lines of a DRAM during READ operation by said control circuit by controlling bit switch ON/OFF timing wherein the duration of data sensing is measured by a data sensing tracking circuit;
   - minimize duration of precharge of data lines of a DRAM during READ operation by said control circuit by controlling bit switch ON/OFF timing; and
   - perform WRITE operations to a DRAM without precharging between WRITE operations.

2. The method of claim 1 wherein input data are assigned to a positive or negative data line according their polarity during WRITE operations.

3. The method of claim 1 wherein said "data sensing tracking" circuit is sensing data out of a test DRAM cell in order to determine the time required for data sensing.

* * * * *